(12) United States Patent
Banno

(10) Patent No.: US 8,664,651 B2
(45) Date of Patent: *Mar. 4, 2014

(54) SWITCHING DEVICE AND METHOD OF MANUFACTURING THE SAME

(75) Inventor: Naoki Banno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/808,392

(22) PCT Filed: Nov. 25, 2008

(86) PCT No.: PCT/JP2008/071311

§ 371 (c)(1),
(2), (4) Date: Jun. 16, 2010

(87) PCT Pub. No.: WO2009/078251

PCT Pub. Date: Jun. 25, 2009

(65) Prior Publication Data

US 2011/0108829 A1 May 12, 2011

(30) Foreign Application Priority Data

Dec. 19, 2007 (JP) ................. 2007-326960

(51) Int. Cl.
*H01L 29/10* (2006.01)
(52) U.S. Cl.
USPC .................. 257/43; 257/E45.003
(58) Field of Classification Search
USPC .......................... 257/E45.003, 43
See application file for complete search history.

(56) References Cited

U.S. PATENT DOCUMENTS 7,116,573 B2 * 10/2006 Sakamoto et al. ............ 365/153
2009/0323157 A1 * 12/2009 Valentin et al. ............... 359/265

FOREIGN PATENT DOCUMENTS

| JP | 2002536840 A | 10/2002 |
| JP | 2006303343 A | 11/2006 |
| JP | 2006319028 A | 11/2006 |
| JP | 2008244090 A | 10/2008 |
| WO | 2006070773 A | 7/2006 |
| WO | 2007-069725 A1 | 6/2007 |
| WO | 2007-114099 A1 | 10/2007 |

OTHER PUBLICATIONS

International Search Report for PCT/JP2008/071311 mailed Jan. 13, 2009.
Japanese Office Action, Record of prior art literature search result, for JP Application No. 2009-546197 mailed on Sep. 17, 2013 with English Partial Translation.

* cited by examiner

*Primary Examiner* — Julio J Maldonado
*Assistant Examiner* — Hajar Kolahdouzan

(57) ABSTRACT

A switching device includes a first electrode (101), a second electrode (102), and a complex oxide ion conducting layer (103) interposed between the first electrode (101) and the second electrode (102). The complex oxide ion conducting layer (103) contains at least two oxides including a metal oxide. The first electrode (101) can supply electrons to the complex oxide ion conducting layer (103). The second electrode (102) contains a metal and can supply ions of the metal to the complex oxide ion conducting layer (103).

7 Claims, 10 Drawing Sheets

SWITCHING DEVICE AND METHOD OF MANUFACTURING THE SAME

This application is the National Phase of PCT/JP2008/071311, filed Nov. 25, 2008, which is based upon and claims the benefit of priority from Japanese Patent Application No. 2007-326960, filed on Dec. 19, 2007, the disclosure of which is incorporated herein in its entirety by reference.

TECHNICAL FIELD

The present invention relates to a switching device which is used in an electronic device such as a programmable logic or memory device and utilizes an electrochemical reaction, and a method of manufacturing the same.

BACKGROUND ART

To diversify programmable logic functions and promote their mounting in electronic devices and the like, a switch (switching device) which interconnects logic cells needs to be downsized to decrease the ON resistance. In this situation, switches using an electrochemical reaction are known to be smaller in dimension and lower in ON resistance than well-known semiconductor switches. A known example of the switching device using an electrochemical reaction is a two-terminal switch disclosed in reference 1 (Japanese Patent Laid-Open No. 2002-536840).

FIG. 12 shows the structure of a two-terminal switch described in reference 1. This two-terminal switch is configured by sandwiching an ion conducting layer 1203 between a first electrode 1201 and second electrode 1202 for supplying metal ions. Switching between the first electrode 1201 and the second electrode 1202 is done by forming and canceling a metal bridge in the ion conducting layer 1203. The two-terminal switch has a simple structure and a simple manufacturing process, and the device dimensions can be decreased to the nm order.

There is also proposed a three-terminal switch with three electrodes that has an ion conducting layer, similar to the two-terminal switch. By arranging the third electrode which controls formation and cancellation of a metal bridge, the three-terminal switch can control the thickness (range) of the metal bridge, improving electromigration resistance.

When the above-described device is applied to a logic device, a large current may flow through the two-terminal switch upon connection and disconnection to damage the logic device because the resistance of the metal bridge is low. The three-terminal switch can control the current because an electrode for controlling formation of a metal bridge and an electrode for transferring an electrical signal are arranged separately. However, the three-terminal switch is more complicated in structure than the two-terminal switch and the device dimensions tend to increase.

Mounting such a switch as the wiring switch of a programmable logic device requires a switching voltage (breakdown voltage) equal to or higher than the logic operating voltage and affinities for the CMOS (Complementary Metal Oxide Semiconductor) manufacturing process. The switching characteristic greatly depends on the material of the ion conductor, so selection and optimization of the ion conductor material are important. An ion conducting layer made of an oxide is promising because the switching voltage can be raised and an affinity for the CMOS manufacturing process is good. For example, reference 2 (Japanese Patent Laid-Open No. 2006-319028) discloses an example in which tantalum oxide is used as an oxide for the ion conducting layer.

DISCLOSURE OF INVENTION

Problems to be Solved by the Invention

However, after the switch using the oxide ion conductor undergoes the CMOS manufacturing process, the leakage current in the OFF state increases, and in some cases, the switch always remains ON. This is because the metal ions of the electrode which supplies them diffuse in the ion conducting layer during a heat treatment in the CMOS manufacturing process. In the switching device using the oxide ion conductor, the electrode which supplies metal ions is in contact with the oxide ion conductor. Owing to this structure, the metal ions of the electrode which supplies them readily diffuse in the ion conducting layer. Hence, metal ions diffuse in the ion conducting layer during the heat treatment in the CMOS manufacturing process, and metal ions are already present when the switching device operates.

As described above, when metal ions are already present, they exist in the ion conducting layer even in the OFF state and increase the leakage current in the OFF state. Depending on a material used for the ion conducting layer, the switching device may always be ON due to the existing metal ions. In this state, the switching device does not normally function. When the switching device is mounted in a programmable logic device, it degrades the reliability of the device.

As a method for avoiding this problem, an oxide having a small diffusion coefficient of metal ions into the ion conducting layer may be adopted as the ion conductor. This can suppress initial failures and breakdowns caused by diffused metal ions. However, the switching voltage greatly rises, and the repetitive switching resistance becomes poor.

The present invention has been made to solve the above problems, and has as its object to improve the reliability of a switching device using an electrochemical reaction without degrading the switching performance.

Means of Solution to the Problems

According to the present invention, there is provided a switching device comprising at least an ion conducting layer containing at least two oxides including a metal oxide, a first electrode which is arranged on one surface of the ion conducting layer and supplies electrons to the ion conducting layer, and a second electrode which contains a metal, is arranged on the other surface of the ion conducting layer, and supplies ions of the metal to the ion conducting layer.

According to the present invention, there is provided a method of manufacturing a switching device including at least an ion conducting layer containing at least two oxides including a metal oxide, a first electrode which is arranged on one surface of the ion conducting layer and supplies electrons to the ion conducting layer, and a second electrode which contains a metal, is arranged on the other surface of the ion conducting layer, and supplies ions of the metal to the ion conducting layer, the method comprising at least the first step of forming a first electrode on a substrate, the second step of forming an ion conducting layer on the first electrode, and the third step of forming a second electrode on the ion conducting layer.

According to the present invention, there is provided another method of manufacturing a switching device including an ion conducting layer containing at least two oxides including a metal oxide, a first electrode which is arranged on one surface of the ion conducting, layer and supplies electrons to the ion conducting layer, a second electrode which contains a metal, is arranged on the other surface of the ion conducting layer, and supplies ions of the metal to the ion conducting layer, and a third electrode which contains the metal, is arranged on one surface of the ion conducting layer, and supplies ions of the metal to the ion conducting layer, the method comprising at least the first step of forming a second electrode on a substrate, the second step of forming an ion conducting layer on the second electrode, the third step of forming a first electrode on the ion conducting layer, and the fourth step of forming a third electrode on the ion conducting layer.

Effects of the Invention

As described above, the present invention employs an ion conducting layer containing at least two oxides including a metal oxide. The present invention can improve the reliability of a switching device using an electrochemical reaction without degrading the switching performance.

BEST MODE FOR CARRYING OUT THE INVENTION

Preferred exemplary embodiments of the present invention will now be described with reference to the accompanying drawings.

[First Exemplary Embodiment]

Figure 1:
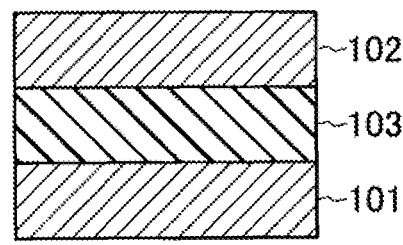
FIG. 1 is a sectional view schematically showing an example of the structure of a switching device in the first exemplary embodiment of the present invention.

The first exemplary embodiment of the present invention will be described. FIG. 1 is a sectional view schematically showing an example of the structure of a switching device in the first exemplary embodiment of the present invention. The switching device includes a first electrode 101, a second electrode 102, and a complex oxide ion conducting layer 103 interposed between the first electrode 101 and the second electrode 102. The complex oxide ion conducting layer 103 contains at least two oxides including a metal oxide. The first electrode 101 can supply electrons to the complex oxide ion conducting layer 103. The second electrode 102 contains a metal, and can supply ions of the metal to the complex oxide ion conducting layer 103. It is desirable that the first electrode 101 does not supply metal ions into the complex oxide ion conducting layer 103 upon applying a voltage.

Figure 2:
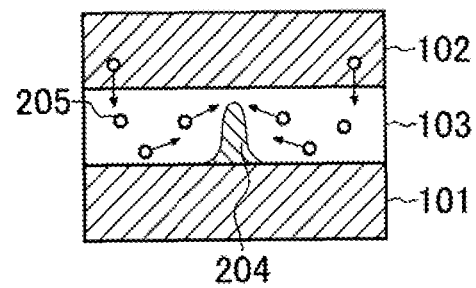
FIG. 2 is a sectional view for explaining an example of the operation of the switching device in the first exemplary embodiment of the present invention.

In the switching device having this structure in the first exemplary embodiment, for example, a predetermined positive voltage is applied to the second electrode 102 while grounding the first electrode 101. Then, as shown in FIG. 2, ions (metal ions) 205 of the metal contained in the second electrode 102 diffuse (dissolve) into the complex oxide ion conducting layer 103. At this time, the first electrode 101 supplies electrons to the complex oxide ion conducting layer 103. The metal ions 205 that have diffused in the complex oxide ion conducting layer 103 combine with the simultaneously supplied electrons and precipitate as a metal. The precipitated metal forms a metal bridge 204 in the complex oxide ion conducting layer 103 on the side of the first electrode 101. The formed metal bridge 204 electrically connects the first electrode 101 and second electrode 102, turning on the switching device.

In the switching device in the ON state in which the metal bridge 204 is formed in the above-described way, a predetermined negative voltage is applied to the second electrode 102 while grounding the first electrode 101. Then, some electrons of the precipitated metal which forms the metal bridge 204 migrate to the first electrode 101 and become metal ions. Some of these metal ions return to the second electrode 102.

After the ionization, part of the metal bridge 204 disappears. For example, the metal bridge 204 is divided into two parts on the sides of the first electrode 101 and second electrode 102. As a result, the electrical connection between the first electrode 101 and the second electrode 102 breaks, turning off the switching device. Before the electrical connection completely breaks when turning off the switching device, the resistance between the first electrode 101 and the second electrode 102 increases, and the interelectrode capacitance changes. After such changes of electrical characteristics, the electrical connection finally breaks.

To turn on the switching device after turning it off in this manner, a positive voltage is applied to the second electrode 102, as described above. In the above description, the first electrode 101 is grounded, but the present invention is not limited to this. For example, the switch may be turned on by applying a negative voltage to the first electrode 101 while grounding the second electrode 102. Alternatively, the switch may be turned off by applying a positive voltage to the first electrode 101 while grounding the second electrode 102.

Next, the complex oxide ion conducting layer 103 will be explained. The complex oxide ion conducting layer 103 is made of tantalum oxide as a metal oxide, and silicon oxide as another oxide. The complex oxide ion conducting layer 103 suffices to contain tantalum oxide as a main component and contain 46 mol % of silicon oxide. The two-element oxide can be formed by, for example, sputtering using a sintered target containing the respective oxides at desired ratios. These oxides can also be formed by simultaneously sublimating the sintered targets of the respective oxides in a single film formation chamber by laser ablation.

In the switching device according to the first exemplary embodiment, diffusion of a metal from the second electrode 102 or the like to the complex oxide ion conducting layer 103 can be suppressed even upon adding thermal hysteresis in the manufacturing process of a well-known semiconductor device such as a CMOS. The above-mentioned problems such as an increase in leakage current and a failure in setting the OFF state can be solved.

The result of measuring the electrical characteristic using an actually fabricated device will be explained. A fabricated switching device (sample) uses a 100-nm thick platinum electrode as the first electrode 101, and a 100-nm thick copper electrode as the second electrode 102. An ion conducting layer made of tantalum oxide is adopted as a reference sample. The complex oxide ion conducting layer 103 in the first exemplary embodiment is employed as a sample. The complex oxide ion conducting layer 103 (ion conducting layer) is formed to have a layer thickness of 15 nm. Note that each sample (switching device) is formed on an interlayer dielectric film on a silicon substrate. In the following measurement, the reference sample and sample are heated in the nitrogen atmosphere under heating conditions of 400° C. and 30 min. A change of the electrical characteristic before and after heating is measured.

Figure 3:
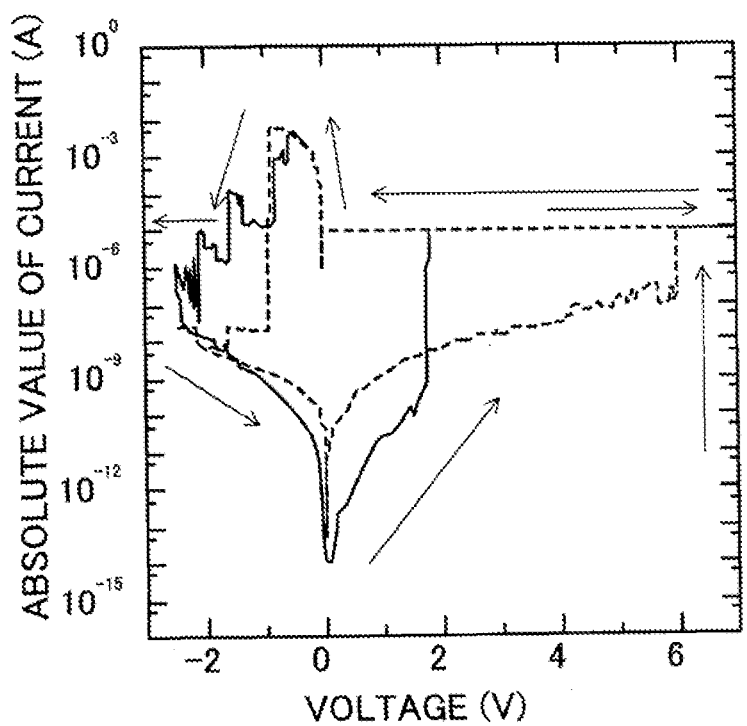
FIG. 3 is a graph showing the result of measuring the electrical characteristic of the switching device in the first exemplary embodiment of the present invention.

In the unheated reference sample, when a positive voltage is applied to the second electrode while grounding the first electrode, the switch changes from the OFF state (high-resistance state) to the ON state (low-resistance state) at 1.8 V, as indicated by a dotted line in FIG. 3. At this time, the upper limit of a current supplied to the reference sample is limited to 10 μA. Then, when a negative voltage is applied, the current decreases at −0.5 V and the switch changes to the OFF state. At this time, the upper limit of a current flowing through the reference sample is controlled to be 50 mA.

After that, the reference sample is heated under the foregoing conditions, and a positive voltage is applied to the second electrode while grounding the first electrode. Then, the switch changes from the OFF state to the ON state at 6.0 V which is approximately four times that in the unheated reference sample, as indicated by a solid line in FIG. 3. A leakage current upon applying a 1-V voltage becomes larger by about two orders of magnitude than that before heating.

Figure 4:
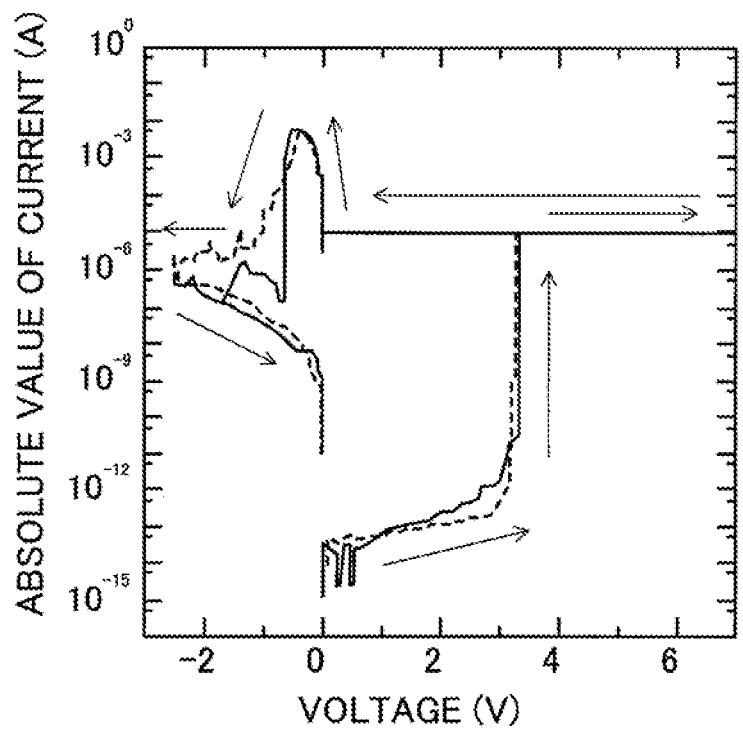
FIG. 4 is a graph showing the result of measuring the electrical characteristic of the switching device in the first exemplary embodiment of the present invention.

The electrical characteristic of the sample corresponding to the switching device in the first exemplary embodiment changes as shown in FIG. 4 before and after heating, compared to the reference sample. First, in the unheated sample, a positive voltage is applied to the second electrode 102 while grounding the first electrode 101. Then, the switch changes from the OFF state (high-resistance state) to the ON state (low-resistance state) at 3.4 V. A leakage current observed upon applying a 1-V voltage becomes smaller by about three orders of magnitude than that in the reference sample. When a negative voltage is applied, the current decreases at −0.4 V and the switch changes to the OFF state. At this time, the upper limit of a current flowing through the sample is controlled to be 50 mA.

Thereafter, the sample corresponding to the first exemplary embodiment is heated under the above-mentioned conditions, and a positive voltage is applied to the second electrode 102 while grounding the first electrode 101. Then, the switch changes from the OFF state to the ON state at 3.4 V, similar to the unheated switch. A leakage current upon applying a 1-V voltage does not change before and after heating.

Figure 5:
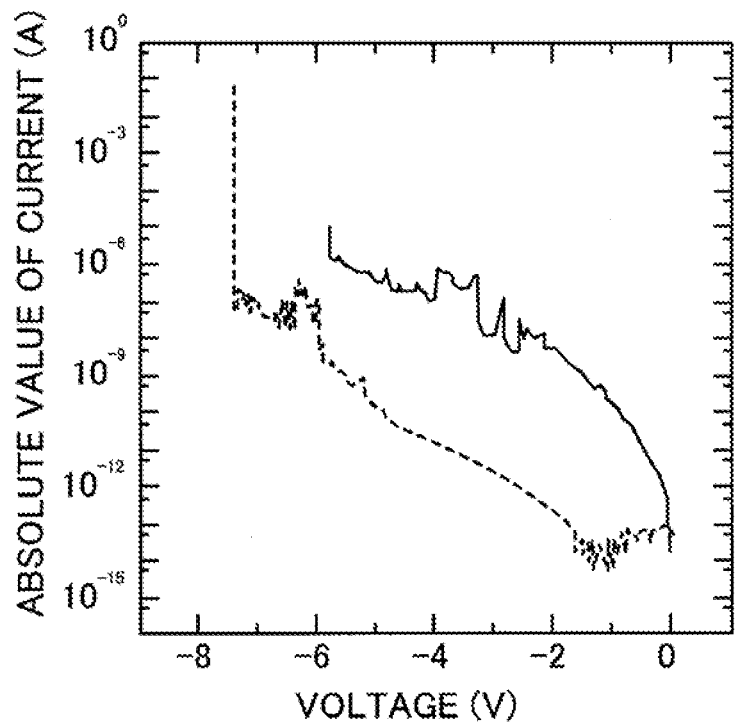
FIG. 5 is a graph showing the result of measuring the electrical characteristic of the switching device in the first exemplary embodiment of the present invention.

FIG. 5 shows the result of applying a negative voltage at which no metal ion is diffused into the ion conducting layer, until the ion conducting layer dielectrically breaks down. In FIG. 5, the solid line indicates the result of the reference sample, and the dotted line indicates that of the sample corresponding to the first exemplary embodiment. As is apparent from FIG. 5, the sample corresponding to the first exemplary embodiment has a smaller leakage current and higher breakdown voltage than those of the reference sample.

The X-ray diffraction measurement result of the complex oxide ion conducting layer 103 in the first exemplary embodiment will be explained. A 50-nm thick complex oxide ion conducting layer to be measured is formed by well-known RF sputtering using a sintered target which is made of tantalum oxide and silicon oxide and contains 46 mol % of silicon oxide. For comparison, a 50-nm thick reference sample formed by RF sputtering using a tantalum oxide sintered target is also measured.

Figure 6A:
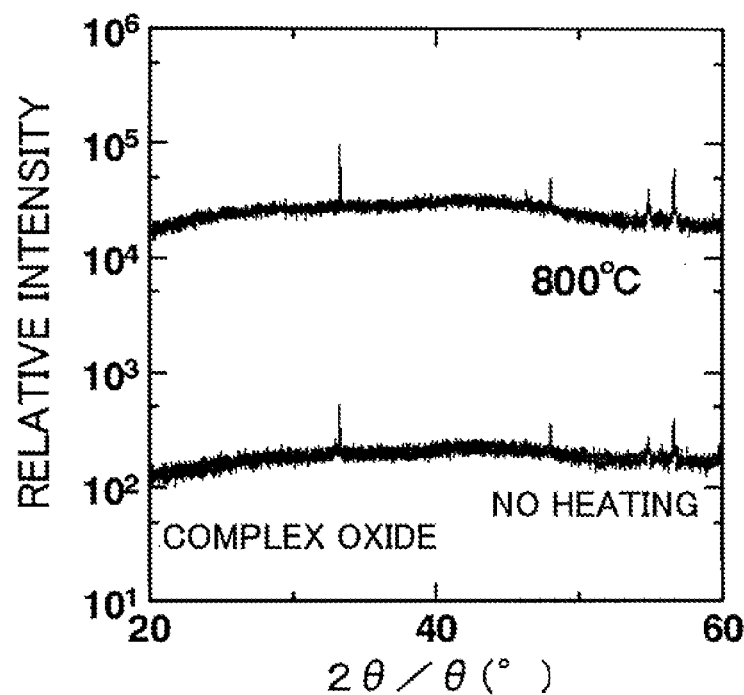
FIG. 6A is a graph showing the X-ray diffraction measurement result of a complex oxide ion conducting layer in the first exemplary embodiment of the present invention.
Figure 6B:
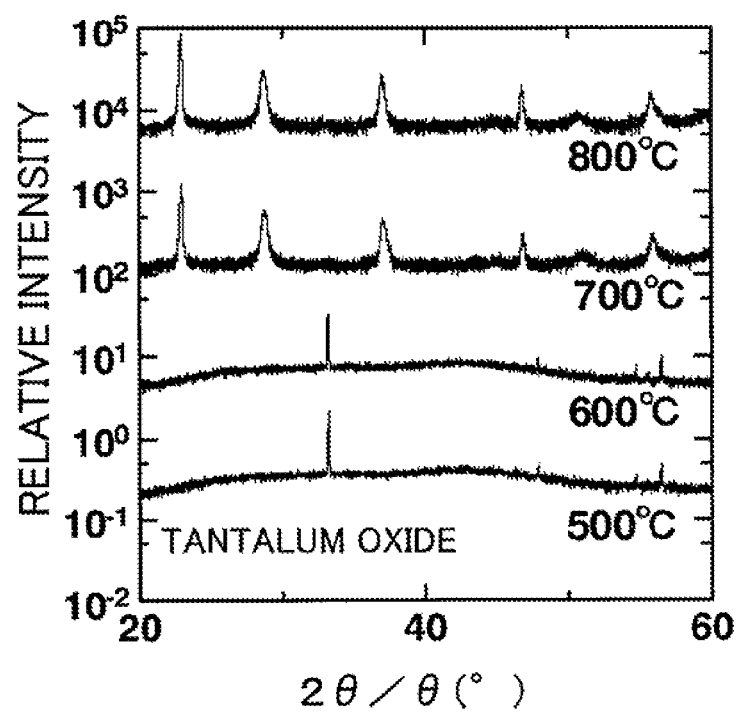
FIG. 6B is a graph showing the X-ray diffraction measurement result of the complex oxide ion conducting layer in the first exemplary embodiment of the present invention.

The X-ray diffraction of the complex oxide ion conducting layer corresponding to the first exemplary embodiment is measured before and after heating at 800° C. The X-ray diffraction of the reference sample is measured after heating at 500° C., 600° C., 700° C., and 800° C. FIG. 6A shows the measurement result of the complex oxide ion conducting layer corresponding to the first exemplary embodiment. FIG. 6B shows the measurement result of the reference sample. In the reference sample, as shown in FIG. 6B, peaks which do not appear at 500° C. and 600° C. appear at 700° C. and 800° C. This reveals that the reference sample crystallizes at 700° C. or higher.

In the complex oxide ion conducting layer, as shown in FIG. 6A, no peak appears even after heating at 800° C. exceeding 700° C. at which the reference sample is considered to crystallize. The complex oxide ion conducting layer is considered to remain amorphous without crystallization. From this, a complex oxide (complex oxide ion conducting layer) obtained by adding silicon oxide to tantalum oxide hardly crystallizes, compared to an ion conducting layer made of tantalum oxide.

In a metal oxide such as tantalum oxide applicable as the ion conducting layer, slight crystallization, which is not reflected in X-ray diffraction, proceeds even in the temperature range of 150° C. to 400° C. in the LSI manufacturing process and use environment that are lower than the crystallization temperature. A complex oxide of tantalum oxide and silicon oxide is harder to crystallize than tantalum oxide, so crystallization in the range of 150° C. to 400° C. is considered to hardly proceed.

As described above, crystallization in the ion conducting layer is one factor which causes diffusion of metal ions into the ion conducting layer owing to the thermal hysteresis in the CMOS manufacturing process. As for a metal oxide such as tantalum oxide, diffusion of metal ions is promoted in the crystalline state more than in the amorphous state. The complex oxide ion conducting layer 103 in the first exemplary embodiment keeps the amorphous state without crystallization even in a high-temperature environment, as described above. Quick diffusion of metal ions through the grain boundaries can be suppressed, thereby suppressing diffusion of metal ions in a high-temperature environment. Therefore, the switching device according to the first exemplary embodiment maintains high reliability without increasing the leakage current even after heating at 400° C. for 30 min, as described with reference to FIGS. 3, 4, and 5.

In the switching device using an electrochemical reaction in the first exemplary embodiment, the voltage (ON voltage) at which the switching device shifts (changes) to the ON state depends on the diffusion rate of metal ions in the complex oxide ion conducting layer 103. If the diffusion rate is excessively low, the ON voltage becomes excessively high, which is not preferable for the switching device. Considering this, the complex oxide ion conducting layer 103 additionally uses silicon oxide in which the diffusion rate of copper ions is as low as about 1/100 of that in tantalum oxide. This prevents an excessive rise of the switching voltage. Note that the same effects as those described above were confirmed even when aluminum oxide was used instead of silicon oxide.

A method of manufacturing the switching device in the first exemplary embodiment will be explained in more detail below using Examples.

[Example 1]

A manufacturing method in Example 1 will be described with reference to FIGS. 7A to 7D.

[Step 1]

Figure 7A:
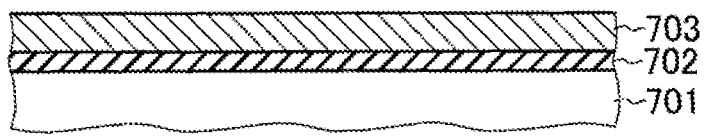
FIGS. 7A to 7D are sectional views for explaining steps in an example of a method of manufacturing a switching device in the first exemplary embodiment of the present invention.

As shown in FIG. 7A, a substrate 701 made of low-resistance single-crystal silicon is prepared. A 300-nm thick silicon oxide film 702 is formed on the surface of the substrate 701. A first electrode 703 made of platinum and having a film thickness of 100 nm is formed on the silicon oxide film 702 by, e.g., vacuum evaporation or sputtering. The first electrode 703 is not limited to platinum, and suffices to be made of a material, such as tungsten, tantalum, or titanium, from which no metal ion elutes into the complex oxide ion conducting layer. On the substrate 701, a plurality of semiconductor elements such as a MOS transistor and resistance element may be integrally formed by a well-known technique. In this case, the silicon oxide film 702 functions as an interlayer dielectric film.

[Step 2]

Figure 7B:
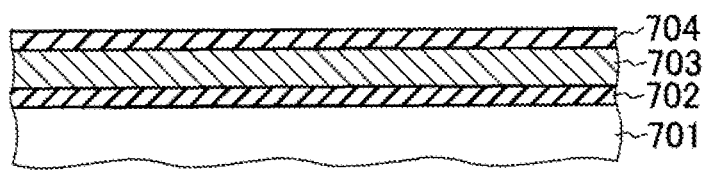

As shown in FIG. 7B, a 15-nm thick complex oxide ion conducting layer 704 is formed on the first electrode 703. For example, the complex oxide ion conducting layer 704 is formed by well-known RF sputtering using a tantalum oxide-based sintered target containing 46 mol % of silicon oxide. At this time, conditions such as the flow rate of supplied oxygen are optimized to make the composition of the formed complex oxide close to that of the target.

For example, RF power applied to the target is set to 100 W, the flow rate of argon gas supplied to the film formation chamber is set to 12 sccm, the oxygen flow rate is set to 0.5 sccm, and the pressure in the film formation chamber is maintained at about 0.5 Pa. Under these sputtering conditions, the complex oxide ion conducting layer 704 is formed to contain tantalum oxide as a base material and 46 mol % of silicon oxide. Note that sccm is the unit of the flow rate and represents that a fluid at 0° C. and 1 atm flows by 1 cm$^3$ per minute.

[Step 3]

Figure 7C:
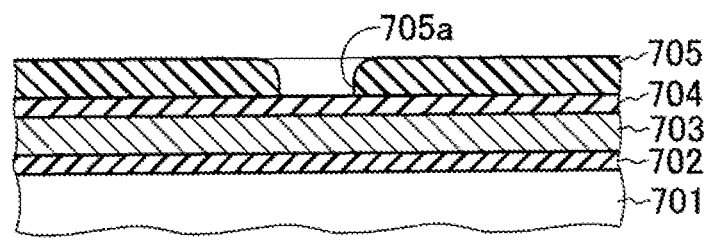

After forming the complex oxide ion conducting layer 704 in this manner, a 100-nm thick insulating layer 705 is first formed from silicon oxide on the complex oxide ion conducting layer 704 by sputtering or CVD (Chemical Vapor Deposition), as shown in FIG. 7C. Then, a photoresist layer is formed on the insulating layer 705 by spin coating using a well-known lithography technique. The photoresist is exposed to a predetermined optical image, forming a latent image. The latent image is developed, forming a resist pattern having an opening at a desired portion. The insulating layer 705 is selectively etched by well-known dry etching using the formed resist pattern as a mask, thereby forming an opening 705*a* through which the surface of part of the complex oxide ion conducting layer 704 is exposed at the bottom.

[Step 4]

Figure 7D:
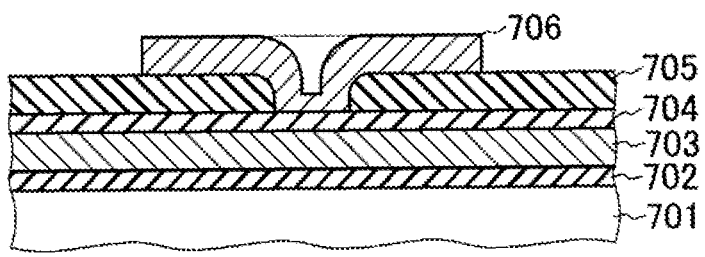

After forming the insulating layer 705 having the opening 705*a*, a copper film is formed by depositing copper on the insulating layer 705 to a film thickness of 100 nm by vacuum evaporation or sputtering. The copper film is processed by a well-known lithography technique and etching technique, forming a second electrode 706, as shown in FIG. 7D. The second electrode 706 is in contact with the complex oxide ion conducting layer 704 in the opening 705*a*.

[Example 2]

A manufacturing method in Example 2 will be described. Example 2 will also be explained with reference to FIGS. 7A to 7D.

[Step 1]

As shown in FIG. 7A, a substrate 701 made of low-resistance single-crystal silicon is prepared. A 300-nm thick silicon oxide film 702 is formed on the surface of the substrate 701. A first electrode 703 made of platinum and having a film thickness of 100 nm is formed on the silicon oxide film 702. This step is the same as that in Example 1 described above.

[Step 2]

As shown in FIG. 7B, a 15-nm thick complex oxide ion conducting layer 704 is formed on the first electrode 703. For example, the complex oxide ion conducting layer 704 can be formed by well-known RF sputtering using two, a tantalum oxide sintered target and silicon oxide target in a single film formation chamber. At this time, conditions such as the flow rate of supplied oxygen and application power to the targets are optimized so that a formed complex oxide has a desired composition. As the desired composition, the complex oxide ion conducting layer 704 contains, for example, tantalum oxide as a base material and 46 mol % of silicon.

For example, RF power applied to the target is set to 100 to 500 W, the ratio of the flow rates of argon gas and oxygen supplied to the film formation chamber is set to 10:3, and the pressure in the film formation chamber is maintained at about 0.5 Pa. Under these sputtering conditions, the complex oxide ion conducting layer 704 is formed to contain tantalum oxide as a base material and 46 mol % of silicon oxide.

[Step 3]

After forming the complex oxide ion conducting layer 704, an insulating layer 705 having an opening 705a is formed on the complex oxide ion conducting layer 704, as shown in FIG. 7C.

[Step 4]

As shown in FIG. 7D, a second electrode 706 is formed on the insulating layer 705.

Steps 3 and 4 are the same as those in Example 1.

[Example 3]

A manufacturing method in Example 3 will be described. In Example 3, a manufacturing method when a switching device is built in the interconnection layer of a semiconductor integrated circuit will be exemplified with reference to FIGS. 8A to 8F.

[Step 1]

Figure 8A:
FIGS. 8A to 8F are sectional views for explaining steps in another example of the method of manufacturing a switching device in the first exemplary embodiment of the present invention.

As shown in FIG. 8A, a substrate 801 made of single-crystal silicon is prepared. A first passivation insulating film 802, first interlayer dielectric film 803, and first stopper insulating film 804 are formed on the substrate 801. On the substrate 801, a plurality of semiconductor elements such as a MOS transistor and resistance element are integrally formed by a well-known technique.

[Step 2]

Figure 8B:
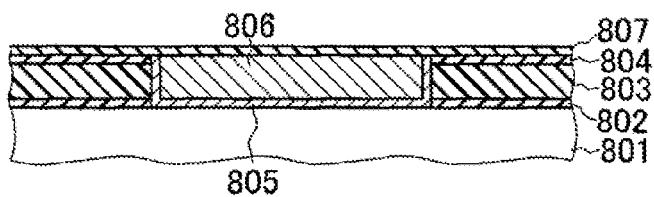

As shown in FIG. 8B, an opening is formed by a well-known photolithography technique and etching technique to extend through the first passivation insulating film 802, first interlayer dielectric film 803, and first stopper insulating film 804. A first barrier metal layer 805 is formed on the first stopper insulating film 804 including the interior of the opening. Then, a copper seed layer is formed on the surface of the first barrier metal layer 805 by sputtering. The copper seed layer suffices to be about 20 to 100 nm thick. Copper is allowed to precipitate on the formed copper seed layer by plating, forming a copper film with a film thickness of about 300 to 800 nm.

The copper film is polished away by well-known CMP (Chemical Mechanical Polishing) until the surface of the first stopper insulating film 804 is exposed. As a consequence, a first interconnection layer 806 is formed from copper on the first barrier metal layer 805 in the opening extending through the first passivation insulating film 802, first interlayer dielectric film 803, and first stopper insulating film 804. Thereafter, a second passivation insulating film 807 is formed on the first stopper insulating film 804. The second passivation insulating film 807 covers the upper surface of the first interconnection layer 806.

[Step 3]

Figure 8C:
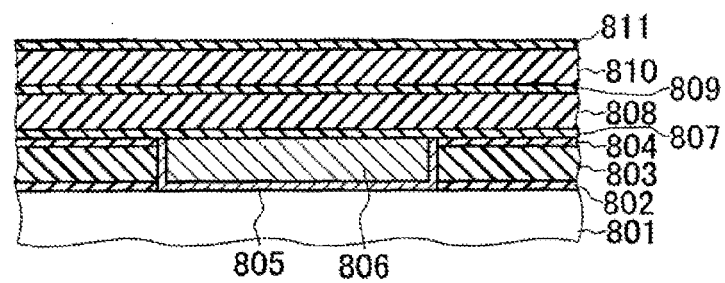

As shown in FIG. 8C, a second interlayer dielectric film 808, third passivation insulating film 809, third interlayer dielectric film 810, and second stopper insulating film 811 are sequentially stacked on the second passivation insulating film 807.

[Step 4]

Figure 8D:
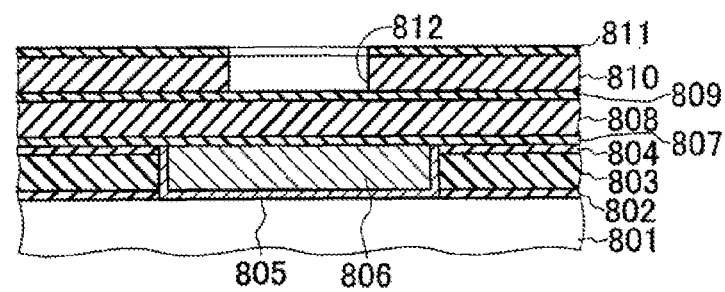

As shown in FIG. 8D, an opening 812 is formed to extend through the second stopper insulating film 811 and third interlayer dielectric film 810. The opening 812 is formed in an opening region for forming an interconnection via for connection to the first interconnection layer 806. The opening 812 suffices to be formed using a well-known photolithography technique and etching technique.

For example, a photoresist layer is formed on the second stopper insulating film 811 by spin coating. The photoresist is exposed to a predetermined optical image, forming a latent image. The latent image is developed, forming a resist pattern having an opening at a desired portion. The second stopper insulating film 811 and third interlayer dielectric film 810 are selectively etched by well-known dry etching using the formed resist pattern as a mask, forming the opening 812 through which the surface of part of the third passivation insulating film 809 is exposed at the bottom. For example, a 90-nm generation lithography technique can form the opening 812 to have a diameter of about 80 to 200 nm.

[Step 5]

Figure 8E:
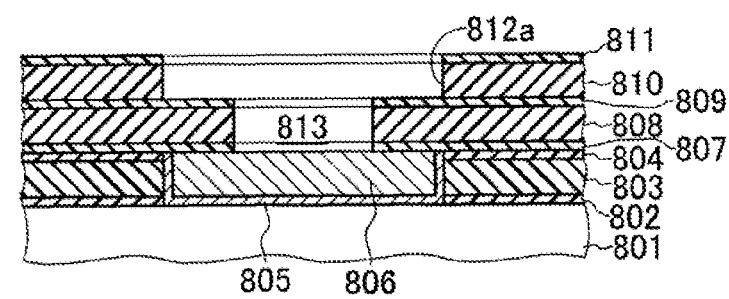

As shown in FIG. 8E, a contact hole 813 is formed to extend through the second interlayer dielectric film 808 and second passivation insulating film 807. An interconnection trench 812a is formed in the second stopper insulating film 811 and third interlayer dielectric film 810. For example, the interconnection trench 812a can be formed using a well-known photolithography technique and etching technique, similar to the foregoing step. In forming the interconnection trench 812a, the shape of the opening 812 which has already been formed is transferred to the second interlayer dielectric film 808 and second passivation insulating film 807, thereby forming the contact hole 813. The interconnection trench 812a is a region where the second electrode of the switching device and the second interconnection layer to be connected to the second electrode are to be formed.

[Step 6]

A second barrier metal 814 to function as the first electrode of the switching device is formed in the formed contact hole 813 and interconnection trench 812a. A complex oxide ion conducting layer 815 is formed on the second barrier metal 814. The complex oxide ion conducting layer 815 suffices to be formed by sputtering, similar to the above-described step, and have a formed layer thickness (deposition thickness) of about 15 nm. After that, a copper seed layer with a layer thickness of about 20 to 100 nm is formed by sputtering, and a copper film is formed on the copper seed layer by plating. The formed copper film suffices to have a film thickness of about 300 to 800 nm. The copper film, second barrier metal 814, and complex oxide ion conducting layer 815 are partially polished away by well-known CMP until the surface of the second stopper insulating film 811 is exposed.

Figure 8F:
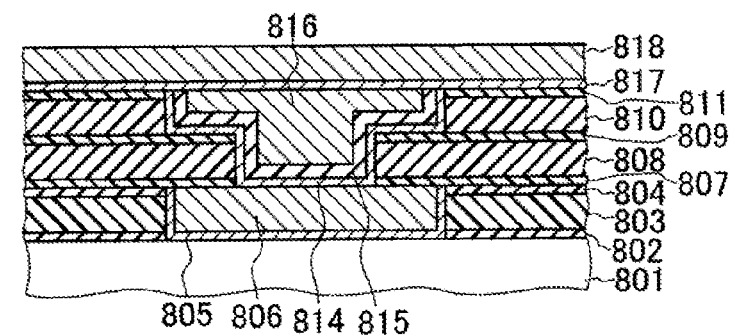

Accordingly, a second interconnection layer 816 is formed from copper in the recessed region on the complex oxide ion conducting layer 815, as shown in FIG. 8F. Then, an upper interconnection layer 818 is formed on a third barrier layer 817 on the second stopper insulating film 811. The upper interconnection layer 818 covers the upper surface of the second interconnection layer 816.

Each passivation insulating film is preferably made of a material which suppresses diffusion of copper from the interconnection layer, such as silicon nitride or a material prepared by adding an arbitrary amount of carbon to silicon nitride. Each interlayer dielectric film is preferably made of a low-permittivity insulating material prepared by adding an arbitrary amount of hydrogen, fluorine, or carbon to a silicon oxide. Further, each interlayer dielectric film is desirably made of a well-known porous film (see non-patent reference 1). The porous film is known to decrease the permittivity more than by the above-mentioned low-permittivity insulating material. Note that the pore size is preferably on the nm order or less.

Each stopper insulating film suffices to be made of a silicon oxide film and have a film thickness of about 50 to 200 nm. Each insulating film can be formed by well-known sputtering or CVD.

The barrier metal suffices to have, for example, a multilayered structure of tantalum nitride and tantalum. The barrier metal is formed to cover the bottom surfaces and side walls of the opening and interconnection trench so as to prevent diffusion of copper into the interlayer dielectric film. The film thicknesses of tantalum nitride and tantalum serving as the barrier metal suffice to be about 5 to 30 nm.

[Second Exemplary Embodiment]

Figure 9:
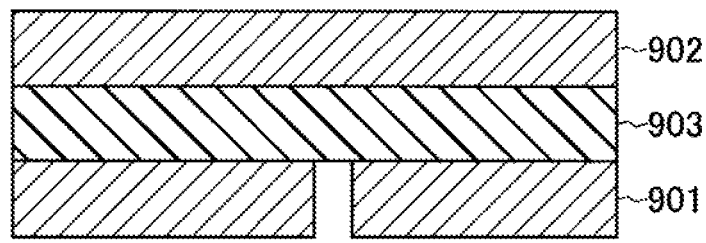
FIG. 9 is a sectional view schematically showing an example of the structure of a switching device in the second exemplary embodiment of the present invention.

The second exemplary embodiment of the present invention will be described. FIG. 9 is a sectional view schematically showing an example of the structure of a switching device in the second exemplary embodiment of the present invention. The switching device includes a complex oxide ion conducting layer 903 containing at least two oxides including a metal oxide, and a first electrode 901 which is arranged on one surface of the complex oxide ion conducting layer 903 and supplies electrons to the complex oxide ion conducting layer 903.

The switching device in the second exemplary embodiment includes a second electrode 902 which contains a metal, is arranged on the other surface of the complex oxide ion conducting layer 903, and supplies metal ions to the complex oxide ion conducting layer 903, and a third electrode 904 which contains the metal, is arranged on one surface of the complex oxide ion conducting layer 903, and supplies metal ions to the complex oxide ion conducting layer 903. The third electrode 904 is arranged on the other surface of the complex oxide ion conducting layer 903 so as to be dielectrically isolated from the second electrode 902. It is desirable that the first electrode 901 does not supply metal ions into the complex oxide ion conducting layer 903 upon applying a voltage.

Figure 10A:
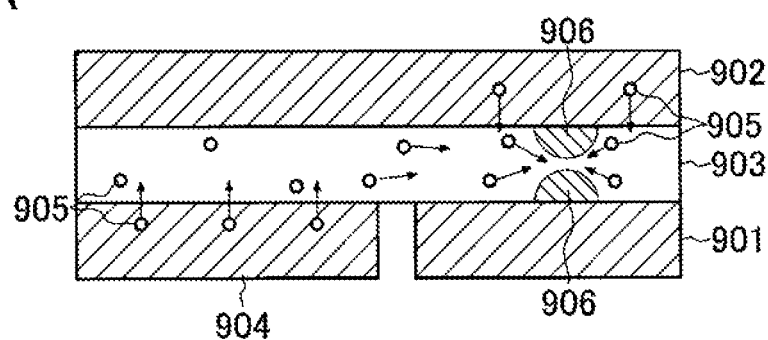
FIG. 10A is a sectional view for explaining an, example of the operation of the switching device in the second exemplary embodiment of the present invention.
Figure 10B:
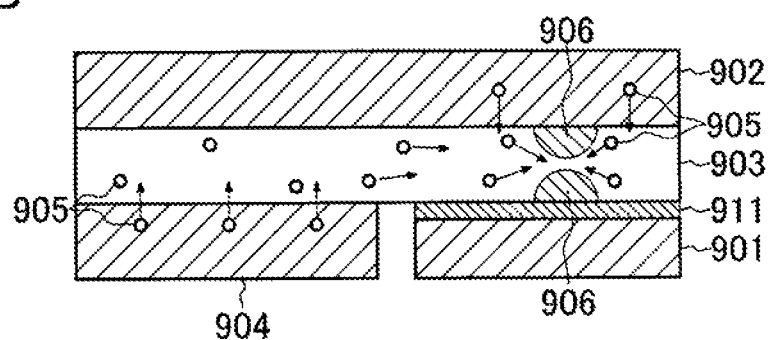
FIG. 10B is a sectional view for explaining an example of the operation of the switching device in the second exemplary embodiment of the present invention.

The operation (driving) of the switching device in the second exemplary embodiment will be exemplified with reference to FIGS. 10A and 10B. The two-terminal operation described above is performed between the first electrode 901 and the second electrode 902 by applying a positive voltage to the second electrode 902 while grounding the first electrode 901. Resultantly, metal bridges 906 are formed in the complex oxide ion conducting layer 903. When a predetermined positive voltage is applied to the second electrode 902 while grounding the first electrode 901, the metal which forms the second electrode 902 ionizes into metal ions 905. The metal ions 905 diffuse (dissolve) into the complex oxide ion conducting layer 903. The dissolved metal ions 905 precipitate in the complex oxide ion conducting layer 903, forming the metal bridges 906. The formed metal bridges 906 connect the first electrode 901 and second electrode 902. By applying a negative voltage to the second electrode 902, the metal bridges 906 partially dissolve, breaking (OFF) the connection between the first electrode 901 and the second electrode 902.

In this fashion, the metal bridges 906 are formed in the complex oxide ion conducting layer 903 to connect the first electrode 901 and second electrode 902. After partially disconnecting the metal bridges 906, the first electrode 901 and second electrode 902 are grounded and a positive voltage is applied to the third electrode 904. The metal which forms the third electrode 904 dissolves as the metal ions 905 into the complex oxide ion conducting layer 903. The dissolved metal ions 905 precipitate at the portions of the metal bridges 906 in the complex oxide ion conducting layer 903, connecting the disconnected portions. As a consequence, the first electrode 901 and second electrode 902 are connected.

A negative voltage is applied to the third electrode 904 in the ON state in which the first electrode 901 and second electrode 902 are connected by applying a positive voltage to the third electrode 904, as described above. In response to this, the metal of part of the metal bridges 906 dissolves into the complex oxide ion conducting layer 903, partially disconnecting the metal bridges 906. At this time, the second electrode 902 recovers the metal ions 905. Hence, the electrical connection between the first electrode 901 and the second electrode 902 breaks, turning off the switching device.

It is also possible to turn on the switching device by applying a negative voltage to the first electrode 901 or second electrode 902 while grounding the third electrode 904, or turn it off by applying a positive voltage to the first electrode 901 or second electrode 902. It is not always necessary that the whole first electrode 901 does not supply metal ions. In other words, it is not always necessary that the first electrode 901 does not contain the metal contained in the second electrode 902 and third electrode 904. It suffices that no metal ion is supplied from the region where the first electrode 901 is in contact with the complex oxide ion conducting layer 903.

For example, as shown in FIG. 10B, the first electrode 901 may be made of the same material as that of the second electrode 902 and third electrode 904. In this case, a conductive barrier layer 911 is arranged at the interface between the first electrode 901 and the complex oxide ion conducting layer 903 to suppress migration of the metal (metal ions). The presence of the barrier layer 911 can suppress diffusion of metal ions which form the first electrode 901 into the complex oxide ion conducting layer 903.

A method of manufacturing the switching device in the second exemplary embodiment will be described with reference to FIGS. 11A to 11D.

[Step 1]

Figure 11A:
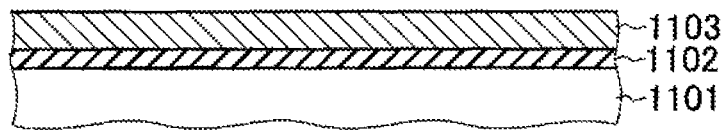
FIGS. 11A to 11D are sectional views for explaining steps in an example of a method of manufacturing a switching device in the second exemplary embodiment of the present invention.

As shown in FIG. 11A, a substrate 1101 made of low-resistance single-crystal silicon is prepared. A 300-nm thick silicon oxide film 1102 is formed on the surface of the substrate 1101. A 100-nm thick second electrode 1103 is formed from copper on the silicon oxide film 1102 by, e.g., vacuum evaporation or sputtering. The second electrode 1103 corresponds to the second electrode 902 in FIG. 9 (FIGS. 10A and 10B).

[Step 2]

Figure 11B:
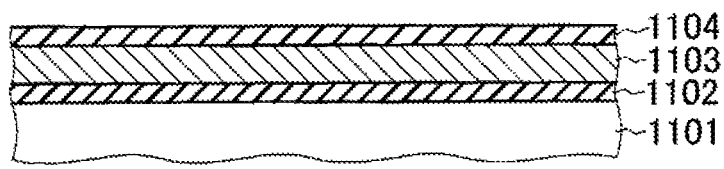

As shown in FIG. 11B, a 15-nm thick complex oxide ion conducting layer 1104 is formed on the second electrode 1103. For example, the complex oxide ion conducting layer 1104 is formed by well-known RF sputtering using a tantalum oxide-based sintered target containing 46 mol % of silicon oxide. At this time, conditions such as the flow rate of supplied oxygen are optimized to make the composition of the formed complex oxide close to that of the target.

For example, RF power applied to the target is set to 100 W, the flow rate of argon gas supplied to the film formation chamber is set to 12 sccm, the oxygen flow rate is set to 0.5 sccm, and the pressure in the film formation chamber is maintained at about 0.5 Pa. Under these sputtering conditions, the complex oxide ion conducting layer 1104 is formed to contain tantalum oxide as a base material and 46 mol % of silicon oxide.

[Step 3]

Figure 11C:
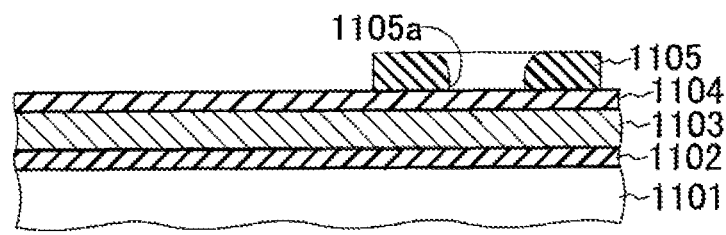

After forming the complex oxide ion conducting layer 1104, a 100-nm thick insulating layer is first formed from silicon oxide on the complex oxide ion conducting layer 1104. Then, a photoresist layer is formed on the insulating layer by spin coating using a well-known lithography technique. The photoresist is exposed to a predetermined optical image, forming a latent image. The latent image is developed, forming a resist pattern having an opening at a desired portion. The insulating layer is selectively etched by well-known dry etching using the formed resist pattern as a mask. As a result, an insulating layer 1105 having an opening 1105a through which the surface of the complex oxide ion conducting layer 1104 is exposed at the bottom is formed in a partial region of the complex oxide ion conducting layer 1104, as shown in FIG. 11C.

[Step 4]

Figure 11D:
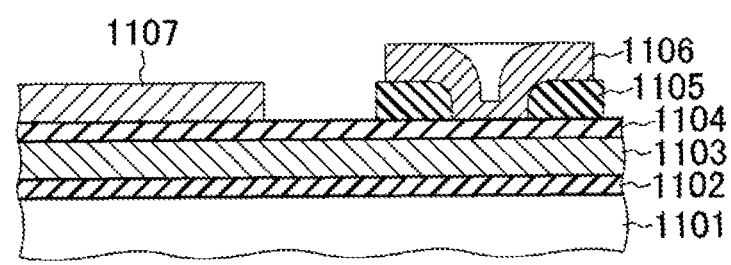
Figure 12:
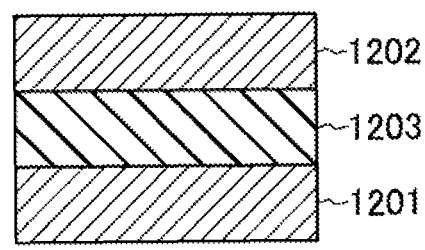
FIG. 12 is a sectional view showing the structure of a two-terminal switch described in reference 1.

After forming the insulating layer 1105 having the opening 1105a, a 100-nm thick platinum film is formed by depositing platinum on the insulating layer 1105 by vacuum evaporation or sputtering. The platinum film is processed by a well-known lithography technique and etching technique, forming a first electrode 1106, as shown in FIG. 11D. The first electrode 1106 is in contact with the complex oxide ion conducting layer 1104 in the opening 1105a. The first electrode 1106 corresponds to the first electrode 901 in FIG. 9 (FIGS. 10A and 10B).

After forming the first electrode 1106, a 100-nm thick copper film is formed on the complex oxide ion conducting layer 1104 including the first electrode 1106 and insulating layer 1105 by vacuum evaporation or sputtering. The copper film is processed by a well-known lithography technique and etching technique, forming a third electrode 1107. The third electrode 1107 corresponds to the third electrode 904 in FIG. 9 (FIGS. 10A and 10B).

In the above-described exemplary embodiments, copper ions are used as metal ions supplied to the complex oxide ion conducting layer, but the present invention is not limited to this. For example, when the complex oxide ion conducting layer contains tantalum oxide as a base material, the second electrode (third electrode) may be made of silver. In this case, silver ions are supplied to the complex oxide ion conducting layer to form a silver metal bridge in the complex oxide ion conducting layer.

In the above-described exemplary embodiments, the complex oxide ion conducting layer contains tantalum oxide as a metal oxide, and silicon oxide as another oxide, but the present invention is not limited to this. For example, the complex oxide ion conducting layer may be made of, as a base material, another metal oxide having a lattice vacancy capable of conducting metal ions. The complex oxide ion conducting layer may be formed by combining (adding), to such a metal oxide serving as a base material, an oxide capable of suppressing crystallization of the metal oxide, as described above. As long as crystallization of the metal oxide can be suppressed, the amorphous state is maintained even at a high temperature in the CMOS manufacturing process. Quick diffusion of metal ions through the grain boundaries can be suppressed, thereby suppressing diffusion of metal ions in a high-temperature environment.

[Third Exemplary Embodiment]

Figure 13:
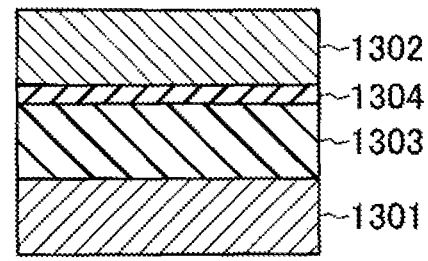
FIG. 13 is a sectional view schematically showing an example of the structure of a switching device in the third exemplary embodiment of the present invention.

The third exemplary embodiment of the present invention will be described. FIG. 13 is a sectional view schematically showing an example of the structure of a switching device in the third exemplary embodiment. The switching device includes a first electrode 1301, a second electrode 1302, and an oxide ion conducting layer (first ion conducting layer) 1303 and complex oxide ion conducting layer (second ion conducting layer) 1304 which are interposed between the first electrode 1301 and the second electrode 1302. The oxide ion conducting layer 1303 is made of a metal oxide such as tantalum oxide.

To the contrary, the complex oxide ion conducting layer 1304 contains at least two oxides including a metal oxide. For example, the complex oxide ion conducting layer 1304 is made of tantalum oxide as a metal oxide, and silicon oxide as another oxide. The complex oxide ion conducting layer 1304 suffices to contain tantalum oxide as a main component and contain 33 mol % of silicon oxide. The complex oxide ion conducting layer 1304 and oxide ion conducting layer 1303 function as media for conducting metal ions.

The first electrode 1301 can supply electrons to the oxide ion conducting layer 1303 (complex oxide ion conducting layer 1304). The second electrode 1302 contains a metal, and can supply ions of the metal to the complex oxide ion conducting layer 1304 (oxide ion conducting layer 1303). It is desirable that the first electrode 1301 does not supply metal ions into the oxide ion conducting layer 1303 and complex oxide ion conducting layer 1304 upon applying a voltage.

The oxide ion conducting layer 1303 can be formed by depositing tantalum oxide by, for example, sputtering. The complex oxide ion conducting layer 1304 can be formed by sputtering using a target prepared by sintering two types of oxides, similar to the first exemplary embodiment. The complex oxide ion conducting layer 1304 can be formed by simultaneously sublimating the sintered targets of the respective oxides in a single film formation chamber by laser ablation.

The multilayered structure of the oxide ion conducting layer and complex oxide ion conducting layer in the third exemplary embodiment increases the switching count after heating, compared to the structure singly using the complex oxide ion conducting layer in the first exemplary embodiment. In the switching device according to the third exemplary embodiment, the complex oxide ion conducting layer 1304 prevents diffusion of metal ions. Also, in the switching device, the metal bridge expands and contracts during driving in the oxide ion conducting layer 1303. The switching device achieves both heat resistance and repetition resistance. In the third exemplary embodiment, the metal bridge expands and contracts in the oxide ion conducting layer 1303. The switching voltage need not be so high, preventing degradation of a portion functioning as an ion conducting layer. Thus, the switching repetition count can be increased. As a feature of the third exemplary embodiment, the oxide ion conducting layer 1303 and complex oxide ion conducting layer 1304 configure the ion conducting layer.

The thickness of the complex oxide ion conducting layer 1304 is optimized so that changes of the switching voltage and leakage current are suppressed to about 10% before and after heating (at 350° C. for 270 min) in the manufacturing process of the wiring switch of a programmable logic device.

Figure 14A:
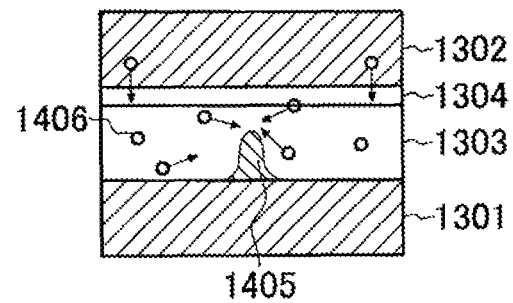
FIGS. 14A to 14C are sectional views for explaining an example of the operation of the switching device in the third exemplary embodiment of the present invention.

Driving of the switching device in the third exemplary embodiment will be explained with reference to FIGS. 14A to 14C. When a positive voltage is applied to the second electrode 1302 while grounding the first electrode 1301, the metal of the second electrode 1302 ionizes into metal ions 1406, as shown in FIG. 14A. The metal ions 1406 dissolve into the complex oxide ion conducting layer 1304 and oxide ion conducting layer 1303. At this time, the first electrode 1301 supplies electrons to the oxide ion conducting layer 1303. The diffused metal ions 1406 combine with the simultaneously supplied electrons and precipitate as a metal. The precipitated metal forms a metal bridge 1405 in the oxide ion conducting layer 1303 on the side of the first electrode 1301.

Figure 14B:
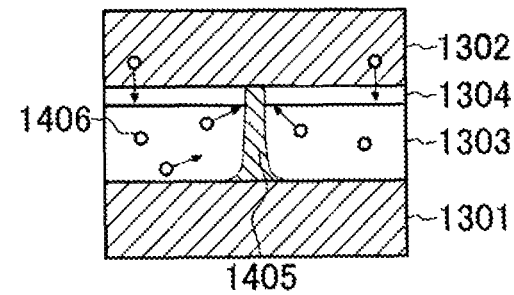

By keeping applying the voltage, the formed metal bridge 1405 reaches the second electrode 1302, as shown in FIG. 14B. The metal bridge 1405 electrically connects the first electrode 1301 and second electrode 1302, turning on the switching device.

Figure 14C:
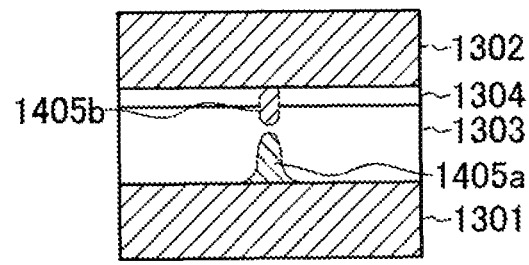

When a negative voltage is applied to the second electrode 1302 in the ON state while grounding the first electrode 1301, the metal bridge 1405 dissolves as the metal ions 1406 into the complex oxide ion conducting layer 1304, disconnecting part of the metal bridge 1405 and dividing it into metal bridges 1405a and 1405b, as shown in FIG. 14C. At this time, the second electrode 1302 recovers the metal ions 1406 in the complex oxide ion conducting layer 1304 and oxide ion conducting layer 1303. Accordingly, the electrical connection between the first electrode 1301 and the second electrode 1302 breaks, turning off the switch.

Before the electrical connection completely breaks when turning off the switch, the resistance between the first electrode 1301 and the second electrode 1302 increases, and the interelectrode capacitance changes. After such changes of electrical characteristics, the electrical connection finally breaks.

To turn on the switch after turning it off, a positive voltage is applied again to the second electrode 1302. It is also possible to turn on the switch by applying a negative voltage to the first electrode 1301 while grounding the second electrode 1302. Also, a positive voltage may be applied to the first electrode 1301 while grounding the second electrode 1302. In response to this, the metal of the second electrode 1302 dissolves as the metal ions 1406 into the complex oxide ion conducting layer 1304 and oxide ion conducting layer 1303. The dissolved metal ions 1406 combine with electrons supplied by the first electrode 1301 and precipitate between the metal bridges 1405a and 1405b. The metal bridges 1405a and 1405b are integrally connected to electrically connect the first electrode 1301 and second electrode 1302, thereby turning on the switching device.

The switching device in the third exemplary embodiment will be described in more detail below using an Example.

[Example 4]

Figure 15:
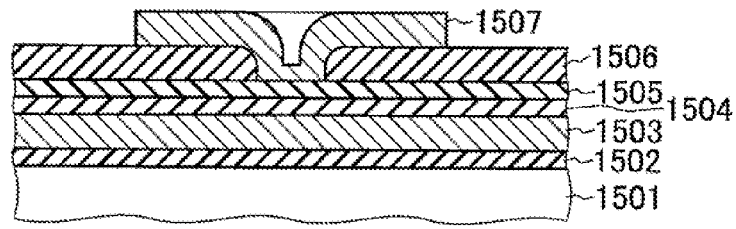
FIG. 15 is a sectional view showing an example of the detailed structure of the switching device in the third exemplary embodiment of the present invention.

The structure of the switching device in Example 4 will be explained with reference to the sectional view of FIG. 15. The switching device includes a substrate 1501 made of low-resistance single-crystal silicon, a silicon oxide film 1502 formed on the substrate 1501, a first electrode 1503 formed on the silicon oxide film 1502, and an oxide ion conducting layer 1504. A complex oxide ion conducting layer 1505 is formed on the oxide ion conducting layer 1504. An insulating layer 1506 is formed on the complex oxide ion conducting layer 1505. A second electrode 1507 is formed on the insulating layer 1506. For example, the insulating layer 1506 covers part of the complex oxide ion conducting layer 1505. The complex oxide ion conducting layer 1505 and second electrode 1507 are connected via an opening (through hole) formed in part of the insulating layer 1506.

The oxide ion conducting layer 1504 is made of tantalum oxide and has a layer thickness of 12 nm. The complex oxide ion conducting layer 1505 is made of tantalum oxide containing 33 mol % of silicon oxide and has a layer thickness of 3 nm. The first electrode 1503 is made of platinum and has a film thickness of 40 nm. The second electrode 1507 is made of copper and has a film thickness of 100 nm.

In the switching device having this structure in the exemplary embodiment, the switch is formed in the region of the through hole formed in the insulating layer 1506. The contact area of the switch can be set to be almost equal to the dimension of the opening of the through hole. On the substrate 1501, a plurality of semiconductor elements (not shown) such as a MOS transistor and resistance element may be integrally formed by a well-known technique. For example, a MOS transistor (not shown) is formed, and the first electrode 1503 is connected to its drain (drain electrode).

Figure 16:
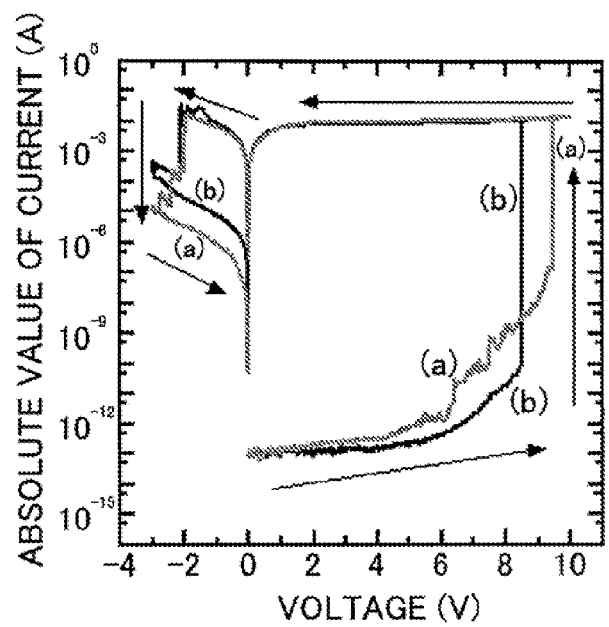
FIG. 16 is a graph showing a change of the electrical characteristic with respect to the operation of the switching device in an example.
Figure 17:
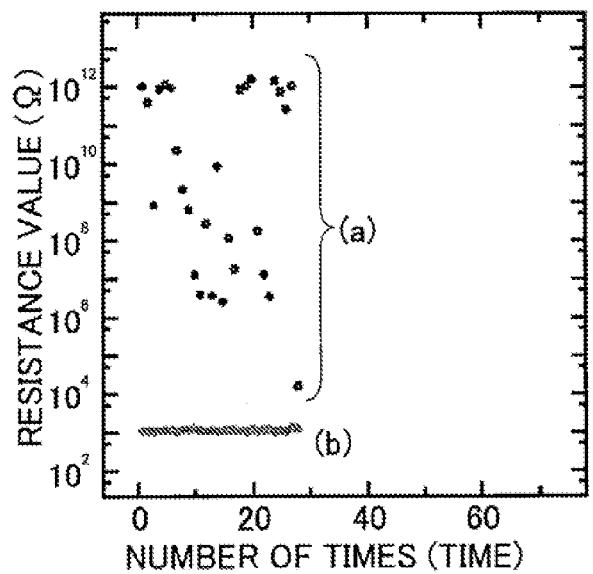
FIG. 17 is a graph for explaining the switching repetition resistance.
Figure 18:
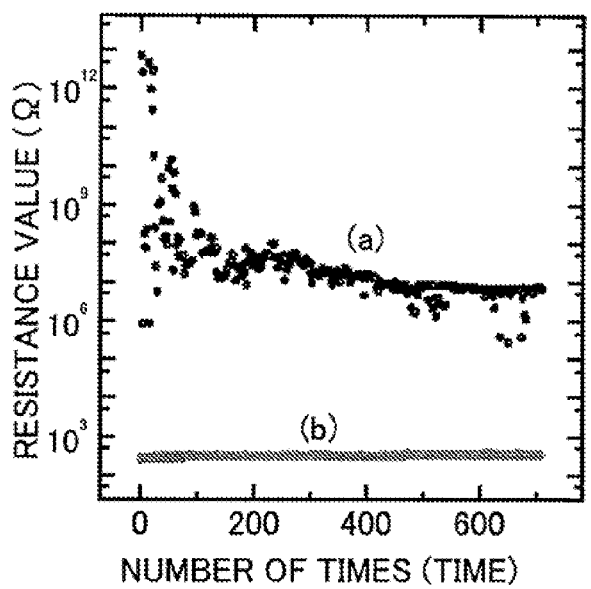
FIG. 18 is a graph for explaining the switching repetition resistance in the third exemplary embodiment of the present invention.

The characteristics of the switching device in the exemplary embodiment will be explained with reference to FIGS. 16, 17, and 18. FIG. 16 is a graph showing a change of the electrical characteristic with respect to the operation of the switching device in the fourth example. In FIG. 16, (a) indicates a characteristic after heating in the nitrogen atmosphere at 350° C. for 270 min, and (b) indicates a characteristic before heating. In this case, the first electrode 1503 is grounded via the drain electrode of an n-type MOSFET (not shown) formed in the substrate 1501, and positive and negative voltages are applied to the second electrode 1507.

In the unheated switching device, when a positive voltage is applied to the second electrode 1507, the switch changes from the OFF state (high-resistance state) to the ON state (low-resistance state) at 8.5 V, as represented by (b) of FIG. 16. At this time, 5 V is applied to the gate electrode of the MOSFET to limit a current flowing through the switching device to about 8 mA. The gate width of the MOSFET is 40 µm. When a negative voltage is applied to the second electrode 1507, the current decreases at −2.2 V and the switch changes to the OFF state. At this time, the MOSFET controls the upper limit of a current flowing through the switching device to be 50 mA.

In the heated switching device, when a positive voltage is applied to the second electrode 1507, as in case of heating, the switch changes from the OFF state to the ON state at 9.5 V, which is higher by about 1 V than that in the unheated switching device (a). A leakage current observed at a voltage of 4 to 7 V becomes larger by about one order of magnitude than that in the unheated switching device. Changes of both the switching voltage and leakage current are suppressed to about 10%.

The switching repetition resistance will be explained. First, a switching device singly using a complex oxide ion conducting layer will be explained. Note that the switching device is heated in the nitrogen atmosphere at 350° C. for 30 min after forming the complex oxide ion conducting layer. In this example, as shown in FIG. 17, the switching device can be switched between the ON and OFF states repetitively up to 28 times. However, for the 29th and subsequent times, the switching device does not change to the OFF state. In FIG. 17, (a) indicates the ON state and (b) indicates the OFF state.

Next, the switching device in the exemplary embodiment using the oxide ion conducting layer in addition to the complex oxide ion conducting layer will be explained. Note that the switching device is heated in the nitrogen atmosphere at 350° C. for 30 min after forming the oxide ion conducting layer and complex oxide ion conducting layer. In this case, as shown in FIG. 18, the switching device can be switched between the ON and OFF states repetitively up to 710 times. The switching repetition resistance is greatly improved.

A method of manufacturing the switching device in Example 4 will be described with reference to FIGS. 19A to 19D.

[Step 1]

Figure 19A:
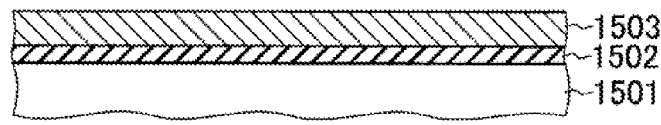
FIGS. 19A to 19D are sectional views for explaining steps in an example of a method of manufacturing a switching device in the third exemplary embodiment of the present invention.

As shown in FIG. 19A, a substrate 1501 made of low-resistance single-crystal silicon is prepared. A 300-nm thick silicon oxide film 1502 is formed on the surface of the substrate 1501. A first electrode 1503 is formed on the silicon oxide film 1502. First, a 40-nm thick platinum film is formed by, e.g., vacuum evaporation or sputtering. Then, a photoresist film is formed on the platinum film and patterned by a well-known photolithography technique, forming a resist pattern having a desired shape (wiring shape).

The platinum film is patterned by dry etching using the formed resist pattern as a mask, thereby forming the first electrode 1503. The first electrode 1503 is, for example, an interconnection which has a predetermined width and runs in the lateral direction on the sheet surface of FIG. 19A. The first electrode 1503 is not limited to platinum, and suffices to be made of a material, such as tungsten, tantalum, or titanium, from which no metal ion elutes into the complex oxide ion conducting layer.

[Step 2]

Figure 19B:
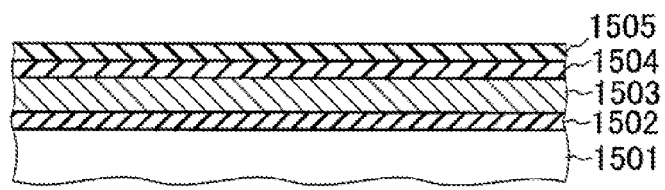

As shown in FIG. 19B, an oxide ion conducting layer 1504 and complex oxide ion conducting layer 1505 are formed on the first electrode 1503. For example, the oxide ion conducting layer 1504 can be formed by depositing tantalum oxide to a thickness of about 12 nm by sputtering using a tantalum oxide sintered target. Subsequently, a 3-nm thick complex oxide ion conducting layer 1505 can be formed by sputtering using a sintered target prepared by adding 33 mol % of silicon oxide to tantalum oxide. After that, the oxide ion conducting layer 1504 and complex oxide ion conducting layer 1505 may be patterned by a well-known photolithography technique and etching technique in conformity with the shape of the first electrode 1503.

[Step 3]

Figure 19C:
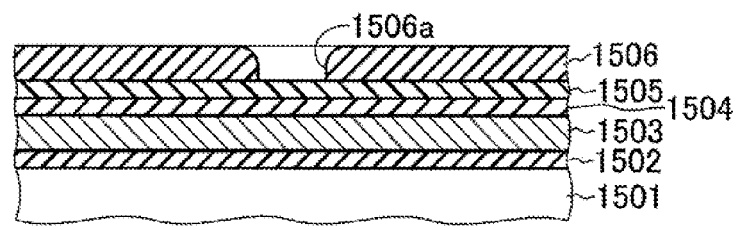

As shown in FIG. 19C, a 40-nm thick insulating layer 1506 is formed from silicon oxide on the complex oxide ion conducting layer 1505 by sputtering or CVD (Chemical Vapor Deposition). Then, a resist pattern having an opening at a desired portion is formed by a well-known lithography technique. The insulating layer 1506 is selectively etched by well-known wet etching using the formed resist pattern as a mask, forming an opening 1506a through which the surface of part of the complex oxide ion conducting layer 1505 is exposed at the bottom.

[Step 4]

Figure 19D:
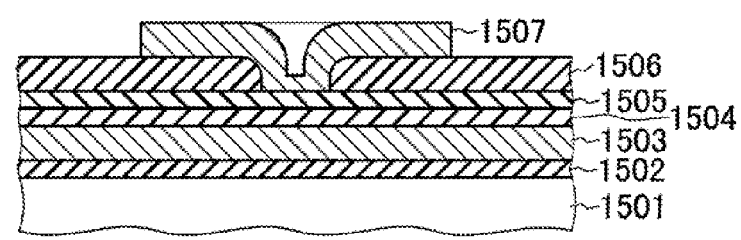

After forming the insulating layer 1506 having the opening 1506a, copper is deposited on it to a film thickness of 100 nm by vacuum evaporation or sputtering, forming a copper film. The copper film is processed by a well-known lithography technique and etching technique, forming a second electrode 1507, as shown in FIG. 19D. In the opening 1506a, the second electrode 1507 is in contact with the complex oxide ion conducting layer 1505.

The present invention has been described with reference to the exemplary embodiments, but the present invention is not limited to them. It will readily occur to those skilled in the art that the arrangement and details of the present invention can be various changed and modified within the scope of the invention.

The invention claimed is:

1. A switching device comprising at least:
   an ion conducting layer containing a complex oxide of tantalum oxide and silicon oxide;
   a first electrode which is arranged on one surface of said ion conducting layer and supplies electrons to said ion conducting layer; and
   a second electrode which contains a metal, is arranged on the other surface of said ion conducting layer, and supplies ions of the metal to said ion conducting layer,
   wherein the ion conducting layer is amorphous.

2. A switching device according to claim 1, wherein said ion conducting layer has a crystallization temperature higher than a crystallization temperature of the tantalum oxide.

3. A switching device according to claim 1, further comprising a third electrode which contains the metal, is arranged on one surface of said ion conducting layer, and supplies ions of the metal to said ion conducting layer,
   said third electrode being arranged to be dielectrically isolated from said first electrode.

4. A switching device according to claim 1, wherein said first electrode is formed in a state in which diffusion of a metal into said ion conducting layer is suppressed.

5. A switching device according to claim 1, wherein said ion conducting layer includes a first ion conducting layer containing tantalum oxide, and a second ion conducting layer containing the complex oxide of tantalum oxide and silicon oxide, and
   said first ion conducting layer is arranged on a side of said first electrode.

6. A method of manufacturing a switching device, comprising at least:
   the first step of forming a first electrode on a substrate;
   the second step of forming an ion conducting layer on the first electrode; and
   the third step of forming a second electrode on the ion conducting layer,
   wherein the ion conducting layer contains a complex oxide of tantalum oxide and silicon oxide,
   the first electrode supplies electrons to the ion conducting layer, and
   the second electrode contains a metal and supplies ions of the metal to the ion conducting layer,
   wherein the ion conducting layer is amorphous.

7. A method of manufacturing a switching device, comprising at least:
   the first step of forming a second electrode on a substrate;
   the second step of forming an ion conducting layer on the second electrode;
   the third step of forming a first electrode on the ion conducting layer; and
   the fourth step of forming a third electrode on the ion conducting layer,
   wherein the ion conducting layer contains a complex oxide of tantalum oxide and silicon oxide,
   the first electrode supplies electrons to the ion conducting layer,
   the second electrode contains a metal and supplies ions of the metal to the ion conducting layer, and
   the third electrode contains the metal and supplies ions of the metal to the ion conducting layer,
   wherein the ion conducting layer is amorphous.

* * * * *